United States Patent [19]

Plesko

[11] Patent Number: 5,596,446
[45] Date of Patent: Jan. 21, 1997

[54] ULTRA COMPACT SCANNING SYSTEM FOR A WIDE RANGE OF SPEEDS, ANGLES AND FIELD DEPTH

[75] Inventor: George A. Plesko, Media, Pa.

[73] Assignee: Gap Technologies, Inc., Media, Pa.

[21] Appl. No.: 332,629

[22] Filed: Oct. 31, 1994

Related U.S. Application Data

[63] Continuation of Ser. No. 776,663, Oct. 15, 1991, Pat. No. 5,371,347, and a continuation of Ser. No. 745,905, Aug. 16, 1991, Pat. No. 5,422,471, and a continuation of Ser. No. 114,646, Oct. 28, 1993, abandoned, and a continuation-in-part of Ser. No. 6,754, Jan. 21, 1993, Pat. No. 5,469,291, which is a continuation-in-part of Ser. No. 612,983, Nov. 15, 1990, Pat. No. 5,187,612.

[51] Int. Cl.⁶ ................................................ G02B 26/08
[52] U.S. Cl. ........................ 359/214; 359/198; 359/199; 235/462; 235/467
[58] Field of Search ................................ 359/198–202, 359/212–215, 223, 225, 226, 900; 250/235–236; 235/467, 462, 472; 310/36, 40 R; 347/260; 358/474, 296, 302; 348/205

[56] References Cited

U.S. PATENT DOCUMENTS

| | | | |
|---|---|---|---|
| 4,367,017 | 1/1983 | Jimbou et al. | 350/486 |
| 4,387,297 | 6/1983 | Swartz et al. | 235/462 |
| 4,502,752 | 3/1985 | Montagu | 359/199 |
| 4,699,447 | 10/1987 | Howard | 350/6.9 |
| 4,758,717 | 7/1988 | Shepard et al. | 235/72 |
| 4,990,808 | 2/1991 | Paulsen | 359/214 |
| 5,097,355 | 3/1992 | Eden | 359/199 |
| 5,130,520 | 7/1992 | Shepard et al. | 235/72 |
| 5,168,149 | 12/1992 | Dvorkis et al. | 235/472 |
| 5,486,944 | 1/1996 | Bard et al. | 359/224 |

OTHER PUBLICATIONS

Duckworth, Henry E.; "*Electricity and Magnetism*"; ©1960 Holt, Rinehart and Winston, Inc.; LC Catalog Card No. 59–8709; Chapter 11, pp. 302, 303, 330.

*Primary Examiner*—James Phan
*Attorney, Agent, or Firm*— Reed Smith Shaw & McClay

[57] ABSTRACT

A non-contact light beam scan system small enough to fit into a hand holdable wand, pen or calculator size terminal incorporates a novel scan element which can scan at rates of ten to hundreds of scans per second in one or two dimensions. The device is immune to low frequency vibrations and can scan large angles of 60 degrees or more. Automatic trigger circuitry enables it to be used equally well in hand held or fixed mount applications. The depth of operating range is extended with a novel focal system which is integrated with the light source. The entire scanning system for generating a beam, focusing the beam electronically, scanning the beam, collecting light from a target and converting it into electrical signals, and automatically generating a trigger signal can work with industry standard low or high speed bar code decoders.

61 Claims, 12 Drawing Sheets

ULTRA COMPACT SCANNING SYSTEM FOR A WIDE RANGE OF SPEEDS, ANGLES AND FIELD DEPTH

This is a continuation-in-part of: U.S. patent application Ser. No. 08/006,754 filed Jan. 21, 1993 entitled "Programmable Gyrating Scanner", now U.S. Pat. No. 5,469,291, which is a continuation in part of U.S. patent application Ser. No. 07/612,983 filed Nov. 15, 1990, issued as U.S. Pat. No. 5,187,612; and of U.S. patent application Ser. No. 07/776,663, filed Oct. 15, 1991 entitled "Electro-Optical Scanning System With Gyrating Scan Head", now U.S. Pat. No. 5,371,347; and of U.S. patent application Ser. No. 07/745,905 filed Aug. 16, 1991 entitled "Scanning Device For Scanning A Target, Scanning Motor For The Device And A Method of Utilization Thereof", now U.S. Pat. No. 5,422,741; and also of U.S. patent application Ser. No. 08/114,646 filed Oct. 28, 1993 entitled "Light Beam Scanning Pen, Scan Module For The Device And Method Of Utilization", now abandoned.

BACKGROUND OF THE INVENTION

1.) Field of the Invention

This invention generally relates to light beam scanning systems and methods of scanning printed indicia such as bar code symbols and other optically discernible materials from which it is desired to extract information.

2.) Description of Prior Art

In a beam scanner a small spot of light is focused upon and swept rapidly across a target from which information is to be read. A bar code reader is an important commercial application of a light beam scanner and is referred to herein as a typical example of a specific application for the present invention. In a bar code reader the light is usually provided by a laser diode emitting red light. After reflection from the target, light is collected onto a photo electric converter such as a photo diode whereupon the collected light is converted into electronic signals representing features of the target.

Millions of portable commercial laser bar code scanners and contact type bar code reading wands presently in service operate at scan speeds on the order of 40 scans per second or less. The large number of installed decoders used with these are only compatible with scanning rates in this speed range. Portable laser scanners like those described in U.S. Pat. No. 4,387,297 typically resemble a personal hair dryer in size and shape. Although these scanners automatically scan a light beam, they must be carefully aimed at bar code targets to be read, and must be positioned within the proper distance range from the target where the beam is sufficiently focused to resolve features of the target. A manual trigger is then pulled with the index finger of the user and a scan attempt is made. The scan attempt can last for up to a second and during this time small adjustments in aiming and range can be made before the read attempt is automatically terminated by the device. Inexperienced users may try to pull the trigger and sweep the scanner past a target hoping to catch it in order to avoid aiming. However, due to relatively slow start up times and the slow scan rates of presently available hand held scanners, the scan line may be too narrow or may simply zigzag above and below the target, missing it entirely. Even experienced users depend on visual feedback to see that the scan line is properly intersecting a bar code target, but no visual feedback on spot focus is available to the user of present scanners. Therefore trial and error is the only way an operator may successfully position the scanner away from the target. In bright lighting conditions the red scan line is difficult to see, and color blind users may not be able to see the red scan line at all. If scan speeds were increased beyond 40 scans per second the scan line would become even more difficult to see. Also, for dense bar codes having narrow lines and spaces, the useful depth of field for most portable laser scanners is only a few inches. (For 6 mil bars and spaces this distance is typically about three inches.) Focus mechanisms similar to those used in automatic cameras might be designed for beam focusing, but these are quite complex and slow and thus have not been successfully commercialized. Some attempts have been made to adapt the hand holdable gun shaped scanners to fixed mount point of sale applications by designing stands for them whereby they are aimed at a counter top area and operated in a continuous scan mode. These attempts have not worked well because even greater skill is needed for an operator to align and position the goods to be read. This usually proves more difficult and cumbersome than manually positioning the scanner. These examples highlight the long standing need for a small scanner which requires little orientation with respect to the target being read and one which is equally suited to both fixed or hand held operation in existing systems. The contact reading wands, which do not scan a beam, must be held in contact with the bar code and manually drawn across it by the user; they are notoriously poor at reading non-flat surfaces, and repeated attempts to read a bar code are often needed. The advantages of a miniature high speed non-contact bar code scanner which may be held with the fingers like a pen were pointed out in U.S. patent application 08/114,646 of which the present application is a continuation-in-part. In that application, miniature beam scan components, hereafter referred to as "scan elements", for a pen size beam scanner are disclosed. Several of the miniature scan elements disclosed therein are capable of scan rates in the range of hundreds to thousands of scans per second. These require special high speed decoders and are not compatible with many of the already installed low speed decoders. Also disclosed are beam scanner embodiments which are low speed but which require delicate torsion springs to achieve low scan speeds.

In designing scan elements of reduced size, it becomes increasingly difficult to produce scan rates which are relatively slow, on the order of 40 scans per second. This is because as the moving components of the scanners such as mirrors, magnets and coils are reduced in size, their inertia is also reduced. Furthermore, a restoring force is usually required for the oscillating scan components and is often supplied by metal springs, torsion elements or the like; these devices, when reduced in size and operated with extremely small inertial loads, cause the resonant frequencies of the scanner to be high, thus tending to produce high scan rates.

Achieving adequate scan angles on the order of 40 degrees also becomes a problem in the design of miniature scanners with mechanical springs or torsion elements. This is so because as the length of a spring element is shortened, so is its range of travel, whereas the elastic limits of many materials used for springs may be approached well before they flex enough to produce sufficient deflection to achieve an adequate scan angle. Operation of such springs close to their elastic limit will lead to fatigue and early failure.

If one attempts to use an extremely thin spring material with a very low force or torsion constant to fabricate a small low frequency scanner, it has been found that such a scanner may be very fragile and susceptible to picking up unwanted external vibrations especially in portable hand held applications.

The present invention incorporates many principles disclosed in the prior patent applications of which the instant application is a continuation-in-part and discloses new embodiments which are miniature in size yet capable of a wide range of scan rates from a very low scan rate of less than ten scans per second to moderately high rates of over one hundred scans per second. At the same time these devices are rugged and can easily achieve scan angles on the order of sixty degrees if necessary. In addition, the depth of operating range is extended with a novel focal system which is integrated with the light source, and special positioning and automatic triggering techniques are disclosed which make the present invention more versatile and equally suited to both fixed mount and hand held operation.

SUMMARY OF THE INVENTION

It is an object of the present invention to provide an extremely compact non-contact scanning system with high immunity to external vibration, suitable for incorporation into wand or pen size information readout devices as well as pocket calculator size terminals having a keyboard and display which can operate at low scan rates on the order of 40 scans per second.

It is another object of the present invention to provide a scan component for scanning a beam below a resonant frequency at a more constant speed than typical resonant scanners have over a range of scan speeds and scan angles.

It is yet another object of the present invention to provide a miniature scan device which will start quickly and stabilize to a specific scan angle with low settling time.

It is still another object of the present invention to provide a self adjusting focus means with the light source and the scan component to form an integrated modular scan system.

It is yet another object of the present invention to provide a miniature scan system which can be adapted for use in a non-contact pen or wand shaped bar code scanner which is compatible with decode equipment operating in the low speed range on the order of 40 scans per second although it may scan significantly faster than 40 scans per second.

It is a further object of the present invention to provide low power, low voltage drive circuitry for the scan system of the present invention which is adapted for portable battery operated equipment.

Still another object of the present invention is to provide visual positioning and range aids to a user. Yet another object of the invention is to provide a scan system with automatic triggering, particularly which is equally suited for fixed mount or hand held use It is yet another object of the present invention to provide a compact scan system which can provide two dimensional scan patterns such as omnidirectional and raster patterns.

These and other objects of the invention will become apparent as the various preferred embodiments are described below.

DETAILED DESCRIPTION OF THE INVENTION

While the following description may refer to a bar code reader and the items being read as bar code targets, it should be understood that the invention is applicable to other information readout devices and equipment requiring beam scanning as disclosed herein. Accordingly, as used herein, the term target refers not only to a bar code but to any item having optically discernible features which require detection and discrimination by means of scanning.

In the following disclosure a device for scanning a beam is referred to as a "scan element" and a scan element in which a beam enters an input end along a first axis and emerges from the scan element scanning about an axis which is substantially parallel to the first axis is referred to as an "axial scan element".

Figure 1:
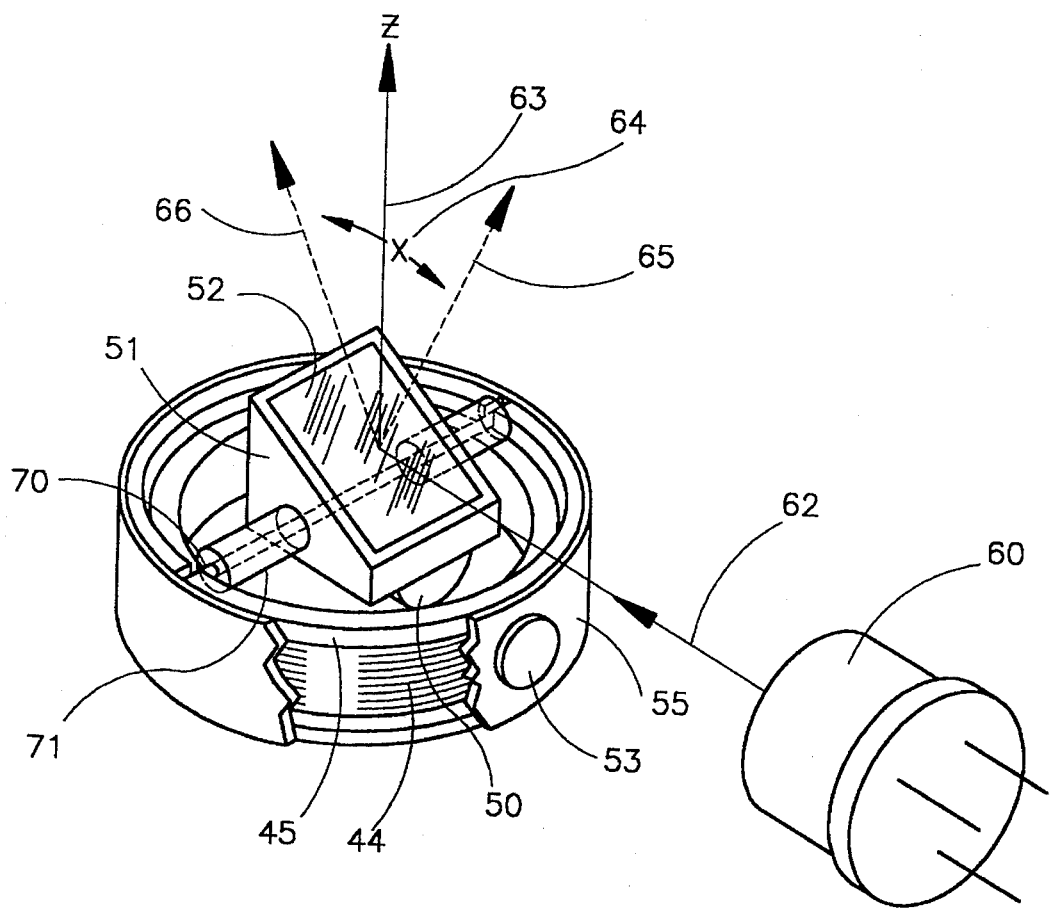
FIG. 1 shows a compact scan element and a light source according to the present invention.
Figure 2:
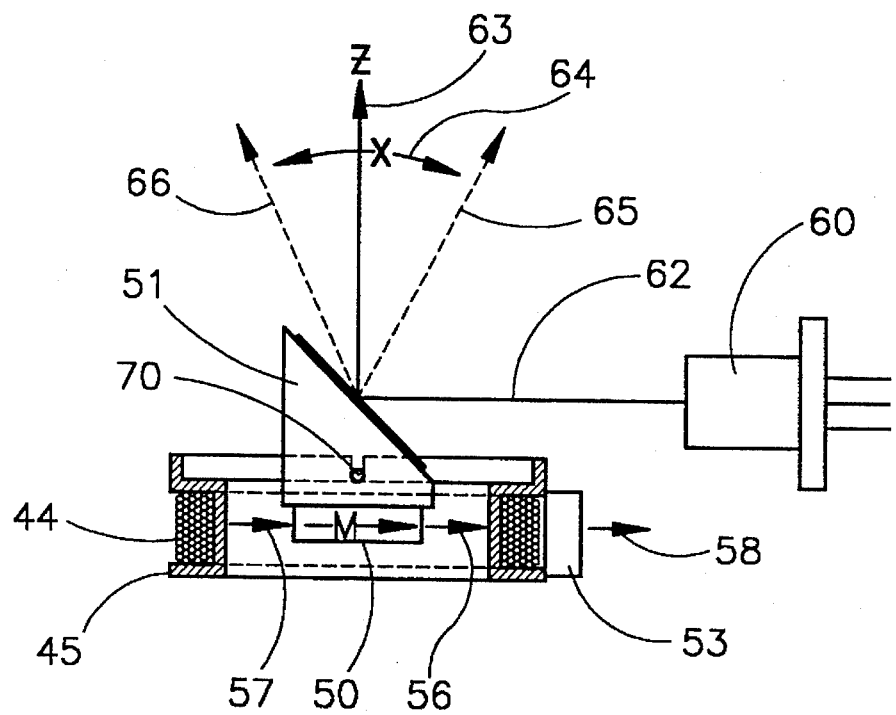
FIG. 2 shows a cross section view of the scan element shown in FIG. 1.

Shown in FIGS. 1 and 2 is a scan element which has no mechanical torsion spring and need not operate at a resonant frequency. Mount 51 is suspended on shaft 70 so it may freely rotate thereon with minimal friction. The mount is best made from a lubricated plastic. Such plastic compounds are available as injection moldable plastics with PTFE and dry silicone lubricants in them to produce extremely low friction and low wear properties. Shaft 70 is preferably made from stainless steel wire and has its opposite ends attached to bobbin frame 45. Mirror 52 is mounted on one end of the mount so that a light beam 62 may reflect from it.

The shaft imparts ruggedness to the mounting of mirror 52 and magnet 50, and restricts the motion of mount 51 to rotational motion on the shaft so that the device when operated as a scan element is not susceptible to picking up unwanted vibrations which can result in disrupted scan patterns.

A means of preventing mount 51 from sliding laterally on the shaft is provided, such as a shoulder or bushing on each side of the mount, like bushing 71 shown in FIG. 1. The bushing is recommended but is omitted from the remaining drawings for clarity of view. An alternate mounting method is to journal the ends of the shaft so the shaft rotates with the mount fixed to it. This will also prevent unwanted lateral sliding of the mount.

A sectional view of FIG. 1 is shown in FIG. 2 for clarity. Magnet 50, magnetized in direction M, is attached to the bottom of mount 51 in the central opening of coil 44. On the outer periphery of coil 44 is a second magnet 53 which is magnetized in the same direction as magnet 50. The lines of force between the two magnets will thus cause magnet 50 to be attracted to magnet 53 thereby automatically bringing it to alignment in the equilibrium position depicted in FIG. 2. It will be recognized by one skilled in basic principles of magnetism that the position of equilibrium for magnet 50 is that of its lowest potential energy state and it will tend to orient itself into the position shown in FIG. 1 with the coil axis 63 also oriented as shown, thereby providing a restoring force for magnet 50 without the use of a mechanical spring. The presence of magnet 53 also causes magnetic flux in the direction of arrow 56 from magnet 50 to concentrate, and directs this flux so that a portion of it will penetrate the windings of coil 44 rather than spreading out diffusely or returning directly to the opposite pole of magnet 50.

Energizing coil 44 with an alternating current will cause magnet 50, mount 51 and mirror 52 to oscillate rotationally about shaft 70 with a rocking motion thereby causing light beam 62 reflected from mirror 52 to be scanned repetitively through angle X to effect a straight line scan about equilibrium position 63 also represented by axis Z. It should be pointed out here that in the assembly of the scan element of FIG. 2 the position of magnet 53 may be adjusted so that the neutral Z-axis is aligned as desired before magnet 50 is permanently secured in place. Furthermore by sliding magnet 53 in a direction out of the page, the force between magnets 50 and 53 will be reduced thereby changing the resonant frequency of the scan element.

Of course it is possible to add another magnet across the diameter of coil 44 and opposite magnet 53 to gain even greater efficiency of operation if the power requirements for a miniature device constructed according to FIG. 2 justifies the extra part. Also it should be noted here that coil 44 need not be circular; it may be square or oval or the like but because of its simplicity a circular coil is illustrated in FIG. 1.

As an example, a scan element like that of FIG. 2 has been fabricated with a coil diameter of about 3/8 inch with a rare earth magnet 53 having a diameter of 1/8 inch and thickness 1/64 inch, whereas a rare earth magnet 50 had a length and width of 1/8 inch and thickness of 1/32 inch. In embodiments of these proportions it was found that the device could operate over a wide range of frequencies with a first oscillatory resonant frequency occurring at about 160 scans per second. The device could also be operated in the broad band range down to less than 5 scans per second. If operated in the range below resonance it will scan at a relatively linear rate, following the applied wave form faithfully with the angle of scan generally proportional to the current applied to the coil requiring only about 20 milliwatts of power to provide a 40 degree scan angle at 40 scans per second. If the scan element is operated at resonance, it executes scans with a generally sinusoidal speed profile and reduced current. If the device of this example were fabricated with a stronger peripheral magnet 53, then it would be suited for operation at higher frequencies.

In the broad band mode of operation ( at frequencies below resonance ), if a triangle wave form is applied to coil 44 of the scan element, then the resulting scanned spot will have a speed which is more constant than that of resonant scanners over most of the scan (except where it must stop and reverse at the end points of each scan). On the other hand, if the wave form has a frequency close to resonance, then the resultant spot speed will not be relatively constant but will reach a peak speed in the middle of the scan. The value of this peak speed ultimately limits the rate at which decoders can process data from a scanner. (The peak speed for a resonant scanner can be as great as four times that of its lowest usable speed during a single scan.)

Thus a scanner which scans with a more constant spot velocity can remain compatible with decoders while operating at higher scan speeds than do those scanners which have non-constant scan rates and high peak spot speeds.

Because the scan elements of the present invention can have relatively constant spot speeds over a substantial portion of their scan angle and speed range, as explained above, they may be operated at substantially higher speeds than 40 scans per second and still remain compatible with standard industry decoders rated for average speeds of only 40 scans per second.

It has also been discovered that when the scan element of FIGS. 1 and 2 is operated below resonance at about 40 scans per second, it can start virtually instantly, presenting a full width line scan with no humanly perceptible starting time, overshoot or settling time. This is a valuable attribute in portable hand held equipment because at speeds of 40 scans per second, slow starting, overshoot and undershoot are readily detected by a human operator and are perceived as sluggishness. Several known scanners which are operated at a resonance of 18 Hz and produce 36 scans per second have slow start characteristics and a user can see the scan line grow to its final width.

Figure 3:
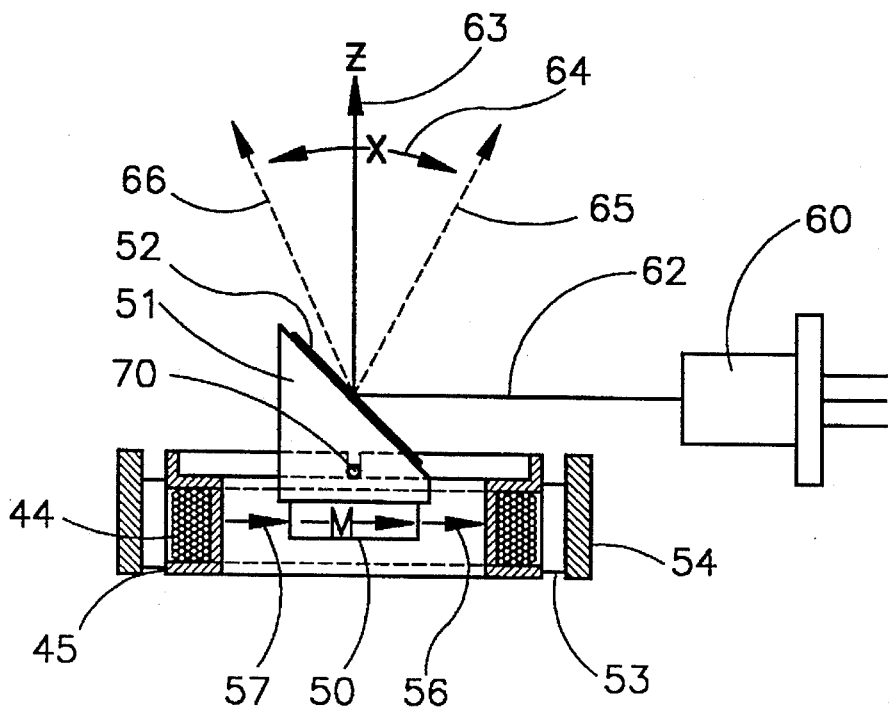
FIG. 3 shows a scan element with a peripheral permanent magnet and ferromagnetic ring for improved performance.

Turning now to FIG. 3, a further enhancement of the device of FIGS. 1 and 2 is shown, wherein a ferromagnetic ring 54 has been added around coil 44. The ring serves to provide a flux return path for the fields of magnets 50 and 53, thereby improving the energy efficiency of the scanner and providing shielding from external magnetic fields which could disturb the scanning characteristics of the scan element.

Figure 4:
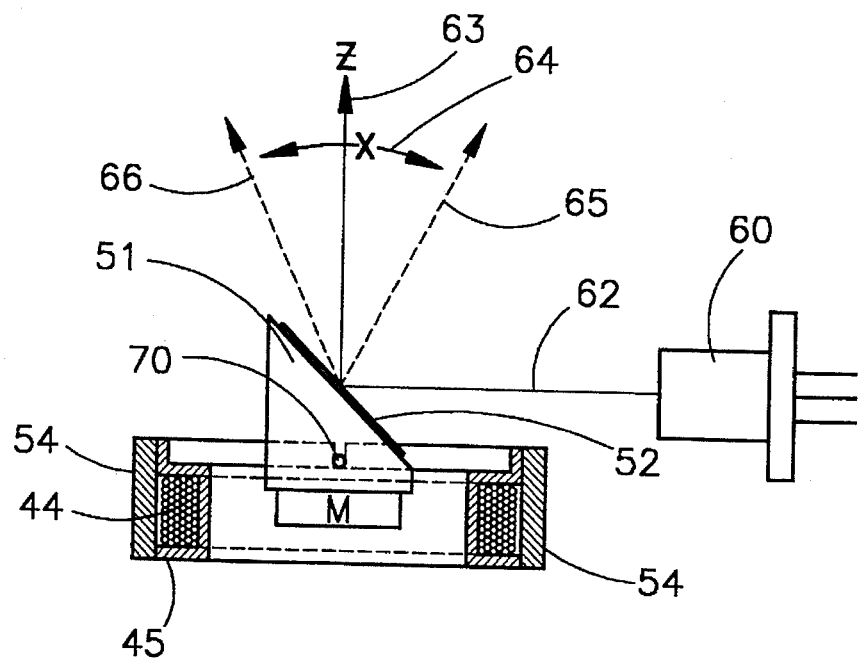
FIG. 4 shows a scan element similar to that of FIG. 3 with only a ferromagnetic ring.
Figure 5:
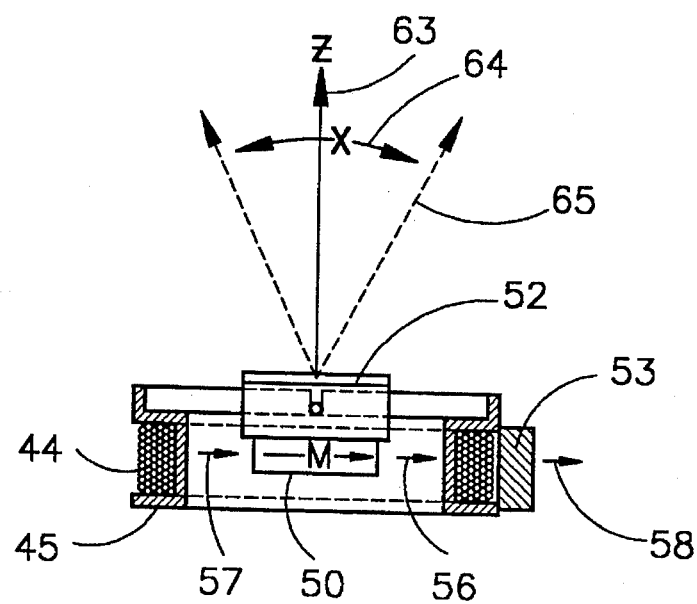
FIG. 5 shows a scan element with its mirror oriented in the direction of the Z-axis.

FIG. 4 shows another embodiment of the device of FIG. 3 but without the peripheral magnet 53, although the ferromagnetic ring 54 is retained in the design. In this arrangement the ring 54 serves to direct flux in at least one of the directions indicated by arrows 56 and 57 from magnet 50 through opposite sides of coil 44, and also serves as a shield against outside magnetic fields. As was explained for the scan element of FIGS. 1 and 2, it will also be recognized that the position of equilibrium for magnet 50 is that of its lowest potential energy state, and magnet 50 will tend to automatically align itself into the position shown in figure 4 with the Z-axis also oriented as shown due to the presence of the ferromagnetic ring around coil 44. This position of minimum energy also establishes the lowest reluctance path for the field of magnet 53. In addition, the ring contains the magnetic flux generated by the coil itself and serves to aid in guiding and concentrating this flux up through the center of coil 44 so that it can more effectively interact with the magnetic field from magnet 50.( The ring need not completely surround the entirety of the coil to serve its purpose. For example it may be split so it can tightly hug the coil or it may have some material removed from a portion of it to provide some adjustability with respect to its flux directing properties by sliding or rotating it with respect to the coil and magnets.) When an alternating current is passed through coil 44 of the scan element of FIG. 4, it will produce a line scan as do the scan elements previously described. It should further be pointed out that it would be possible to substitute an electromagnet for magnet 53.

The scan element of FIG. 4 has fewer parts than do some embodiments described herein, and has several desirable characteristics as follows:

(a) it does not have the extra peripheral magnet as do the scan elements of the previously described embodiments and is therefore less expensive and can be somewhat smaller, (b) it will have a very low resonance frequency since the stronger force of a peripheral magnet is not present, (c) although not quite as efficient as some of the previously described embodiments, it can be operated with little power at or near resonance yet it will still start quickly with very short settling time.

Figure 6:
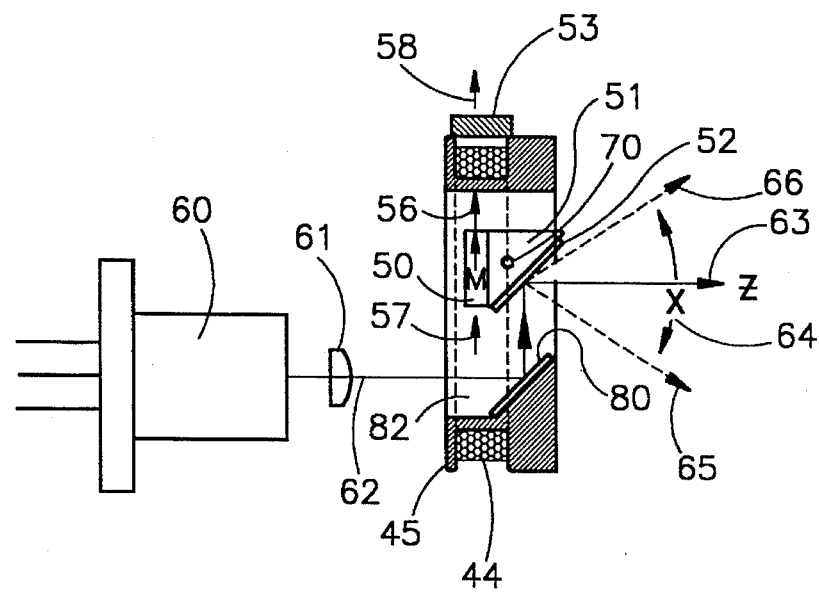
FIG. 6 shows an axial or in-line scan element with a peripheral magnet.

Now turning to FIG. 6 it is seen how the scan elements of FIGS. 1, 2, 3, 4 or 5 may be adapted for operation as an inline scan element, hereafter referred to as an "axial scan element". In FIG. 6 an embodiment of the present invention is shown wherein an input beam 62 enters the device at one end and emerges from the device scanning about axis 63 which is generally parallel to beam path 62, i.e. essentially in the same direction as the incident light beam that entered it. With this embodiment it is possible to create an extremely compact and simple in-line optical layout for a scanner making possible a non-contact scanner shaped like a pen or wand. Such pen and wand scan systems have been described in patent applications of which the present invention is a continuation-in-part. However, for the pen or wand configurations the axial scan elements disclosed herein are preferred for, but not limited to, scan rates on the order of 40 scans per second. These versatile scan elements are rugged, and small and may be operated at low speeds which are compatible with the many low speed decoders already in service or they may be operated at speeds several times higher.

Figure 7:
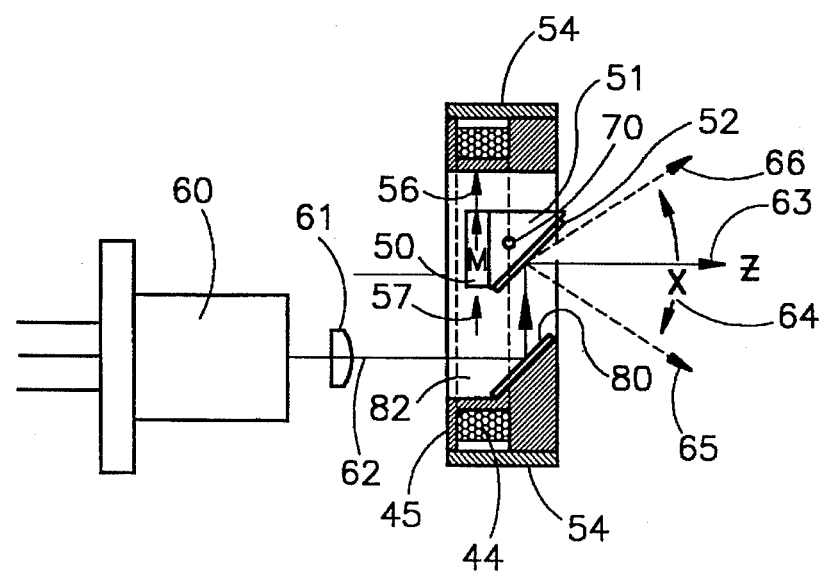
FIG. 7 shows an axial scan element with a ferromagnetic ring.

For a scanner employing the axial scan elements of FIGS. 6 and 7, a light beam from light source 60 is shaped into a narrow beam 62 by positive lens 61 and directed through an opening 82 in the scan element whereupon the beam is reflected by first mirror 80 after which it is again reflected by second movable mirror 52 and finally emerges from the scan element traveling in the same general direction which it originally had with only a slight lateral displacement. When coil 44 is energized with alternating current, beam 62 is scanned repeatedly through angle X about axis 63 by employing the same electromagnetic principles as in the previously described embodiments. The axial scan embodiment is considered the most compact embodiment and therefore the best embodiment for pen shaped non-contact scanners. It should be noted that in accord with elementary principles of optics, the axial scan element may be operated in reverse by first reflecting an input beam from the movable mirror 52 then from the fixed mirror 80.

Figure 16:
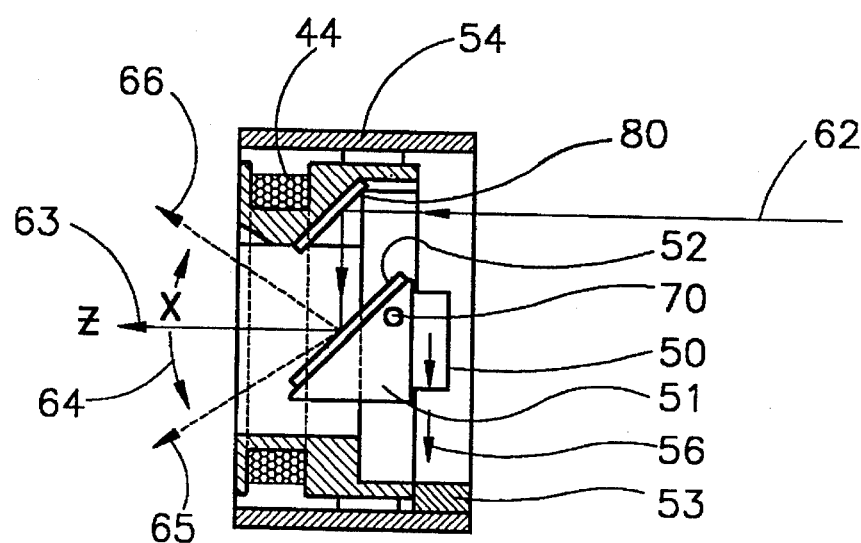
FIG. 16 shows another axial scan element according to the present invention.

Now turning to FIG. 16 another variation of an axial scan element is seen in which coil 44 is displaced along its axis 63 with respect to movable magnet 50. Although this embodiment may not be quite as magnetically efficient as some of the embodiments previously discussed, it nevertheless has been found to work admirably well, requiring less than 10 milliamps at less than 4 volts to scan a beam over 40 degrees at 40 scans per second. A version of it has been built and operated without ring 54. An advantage of this latter configuration is that it may be made even smaller in diameter than the element of FIG. 6, for example, while still retaining the quick start with minimal overshoot capability at low speeds.

Figure 15:
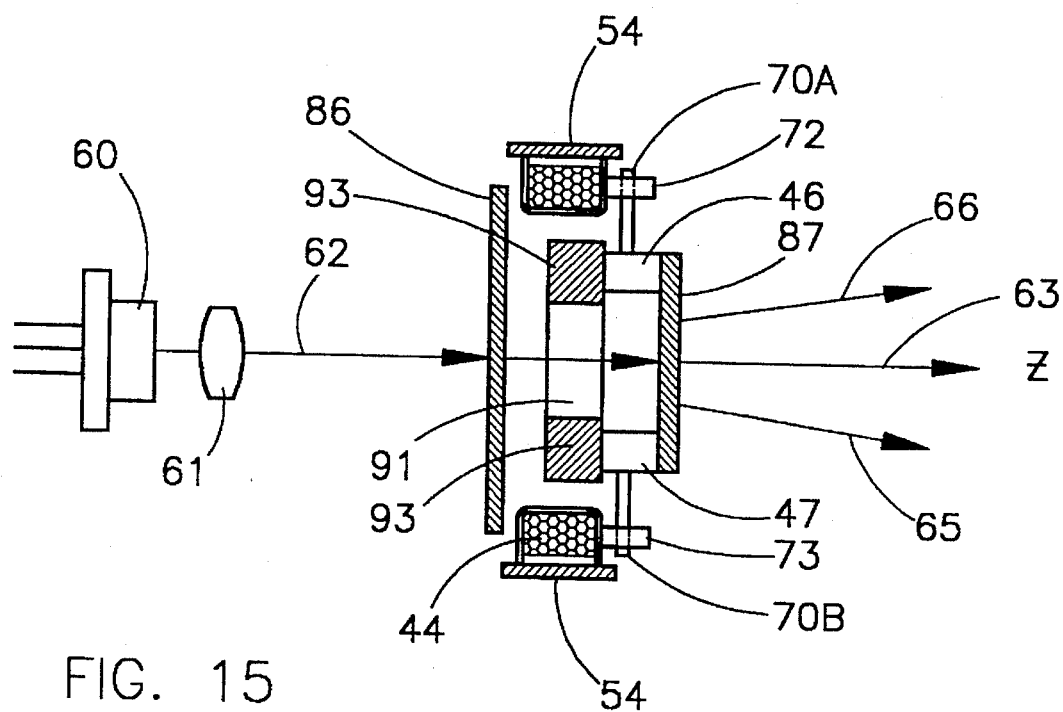
FIG. 15 shows an axial scan element which produces no lateral beam displacement.

It is possible to eliminate the slight lateral displacement of the beam mentioned in the description of FIG. 6. Referring now to FIG. 15 an embodiment is shown in which the beam is not laterally displaced. Beam 62 is directed at mirror 86 which is 50% reflective and therefore 50% transmissive. The portion of the beam passing through mirror 86 then passes through hole 91 provided in magnet 93 and encounters movable mirror 87 which is also 50% transmissive whereupon 25% of the original beam passes directly through it as a fixed non-moving beam which is suitable for an aiming aid. Another 25% of the beam is reflected back to mirror 86 but this portion of the beam is being scanned due to the fact that it has been reflected from moving mirror 86. Fifty percent of this portion of the beam will pass through mirror 86 and will be lost and 50% of it, or 12 ½ % of the original beam will be reflected again to mirror 87 whereupon half of this or 6 ¼ % of the original beam finally emerges as scanned beam 63. A visible laser diode with an output power of 5 milliwatts may be used for the light source 60, thereby delivering a scanned beam output of 0.3125 milliwatts, which is adequate for a noncontact bar code scanner capable of reading targets at a distance of one to two feet. Since the application of power from the laser is intermittent, requiring only a fraction of a second to scan a target, power consumption is not a critical issue even for portable battery powered equipment. Shafts 70A and 70B, coil 44 and peripheral magnet 53 function in the same manner as for other scan elements of the present invention which have been previously described.

MULTI LINE SCANNING

It is desirable in some target scanning applications to generate multiple scan lines in order to cover a two dimensional area. Some examples are: (a) where it is desirable reduce the requirement for critical alignment of the target to the scanner at check out counters for example, (b) where damage or dirt is present on the target and multi dimensional scanning is useful for making different passes across the target, (c). where sophisticated two dimensional scanning needed to read two dimensional bar codes especially in portable applications. These and other requirements are fulfilled by the present invention as shall now be explained.

Figure 8:
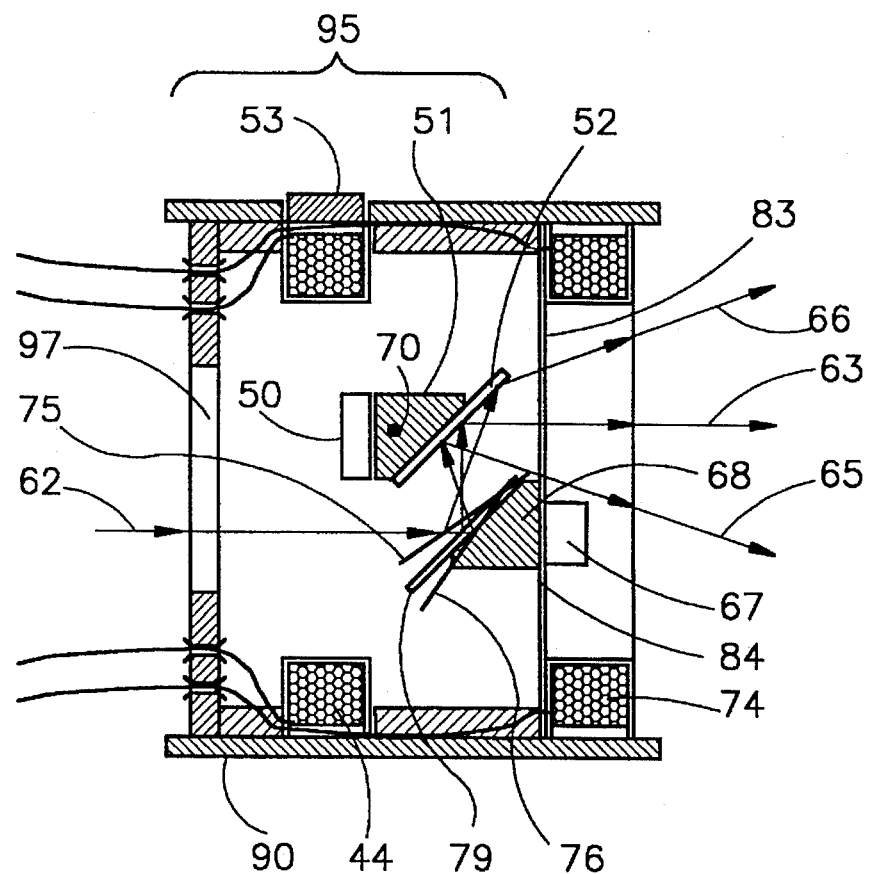
FIG. 8 shows a two dimensional axial scan element.
Figure 9:
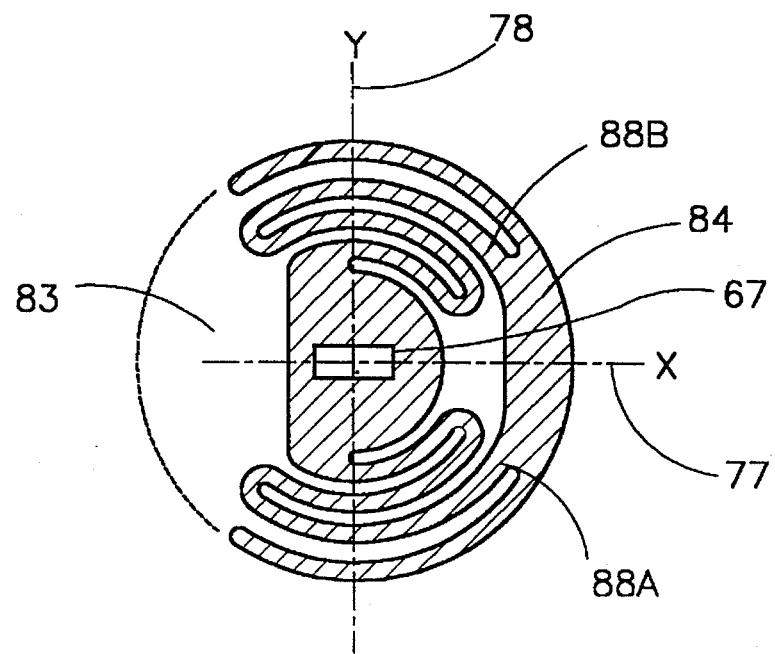
FIG. 9 shows a suspension for use with the scan element of FIG. 8.
Figure 19:
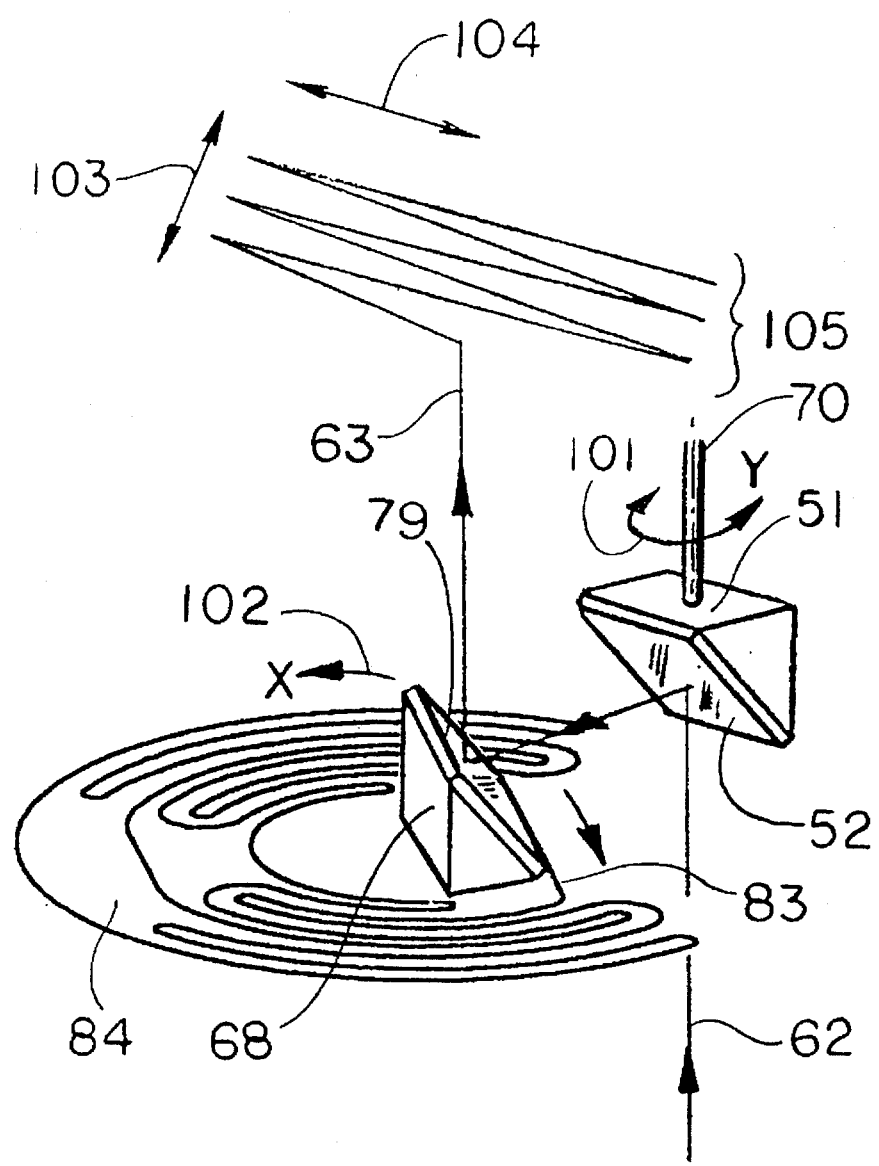
FIG. 19 shows a preferred juxtaposition of two mirrors in an axial scan element similar to that of FIG. 8.

FIG. 8 shows an axial scan element capable of scanning a beam over two dimensions. In the device of FIG. 8 portion 95 includes an axial scan element as has already been described. Beam 62 reflects from optical element 79 which is disposed to reflect the beam again from movable mirror 52 after which it exits the device moving about neutral axis 63. A mirror is considered the simplest and best choice for optical element 79 but it could also be a refractive element or the like. Optical element 79 is caused to move with a rocking motion on an axis substantially orthogonal to the rocking motion of mirror 52 which rocks about shaft 70. Optical element 79 is mounted to flexible suspension element 84 of FIG. 9. Flexible suspension element 84 is actually capable of both X and Y compound movement and was described in U.S. patent application Ser. No. 08/114,646 of which the instant application is also a continuation-in-part. For the utmost control of a two dimensional raster pattern the juxtaposition of mirrors 52 and 79 as depicted in FIG. 19 is desirable wherein the planes of the mirrors are arranged at 45 degrees with respect to one another. Thus each mirror is only required to execute single dimensional motion and a raster scan 105 can be produced with excellent control.

Turning back to FIG. 8 now, area 83 of suspension element 84 allows unimpeded passage of beam 63. Magnetic element 67, also attached to suspension 84, can be a permanent magnet which preferably is magnetized in a direction mutually perpendicular to axis 63 and the direction of magnetization of magnet 50. Magnetic element 67 moves reflective element 79 and scans beam 62 in response to current in coil 74. Thus when both reflective elements 52 and 79 are moved, a two dimensional scan is obtained which can scan an area.

It is important to note here that the device of FIG. 8 can be operated as a two dimensional scanner without coil 74 and thus constitutes an important embodiment of the present invention. If flexible suspension element 84 is made from relatively stiff, flat beryllium copper alloy, for example, it can have very high resonant frequencies of hundreds of Hertz in more than one direction with little response at low frequencies. By superimposing a high resonant frequency on a low frequency and introducing both frequencies into coil 44 alone both reflective elements 52, and 79 will oscillate orthogonal to and essentially independently of one another, thereby producing a two dimensional scan pattern. A raster pattern is an extremely useful two dimensional pattern which the device of FIG. 8 can produce and is well suited for reading two dimensional bar code. Ideally such a raster is generated when the wave form delivered to coil 44 consists of a low frequency triangle wave to produce low speed linear scans by mirror 52 in a first direction and very high speed scans in a second direction perpendicular to the first. This results in many closely and evenly spaced scan lines forming the raster. FIG. 19 shows the juxtaposition of mirrors 52 and 79 which are positioned at about 45 degrees with respect to one another for efficient raster production.

MULTI LINE OMNI SCAN METHOD

A novel method for scanning a randomly oriented bar code target without the need to carefully aim the scanner can also be achieved with the scan element of FIG. 8. By amplitude modulating the angular excursions of at least one of the mirrors 52 or 79, of the 2-D scan element in FIGS. 8 or 19 a continuously variable aspect ratio scan pattern is produced as shown in the sequence of FIGS. 18a, 18b, 18c, and 18d. In this sequence, bar code target 202 is shown with no special orientation with respect to the X–Y plane but which will be scanned successfully using the following method without the need to reorient it.

Figure 18B:
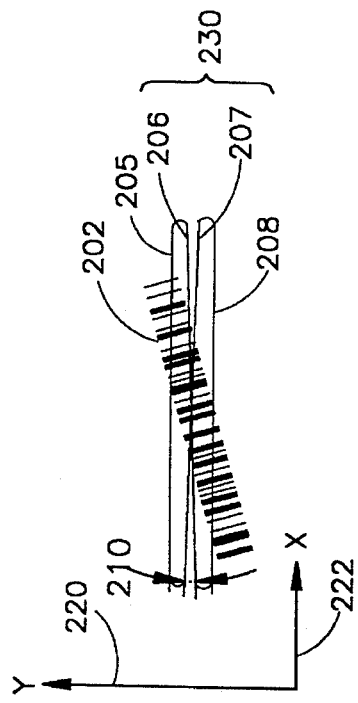
FIG. 18b shows a scan pattern produced in two dimensions where the movement in the Y direction is less than that in the X direction.
Figure 18A:
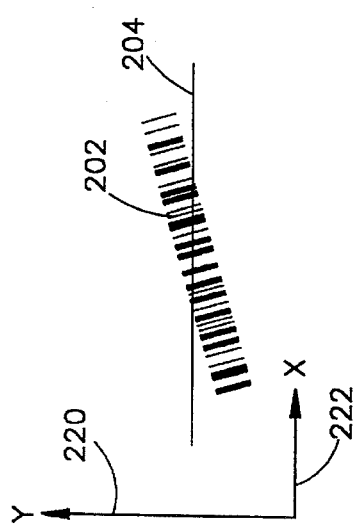
FIG. 18a shows a scan line produced in the X direction.
Figure 18D:
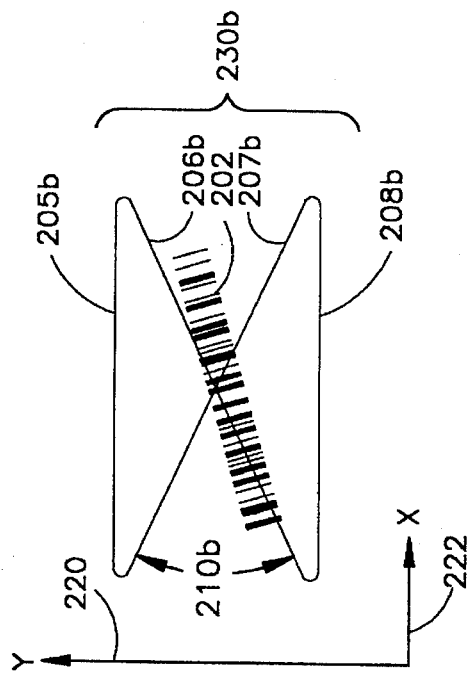
FIG. 18d shows a two dimensional scan pattern similar to that of FIG. 18c but with an aspect ratio having greater Y motion.
Figure 18C:
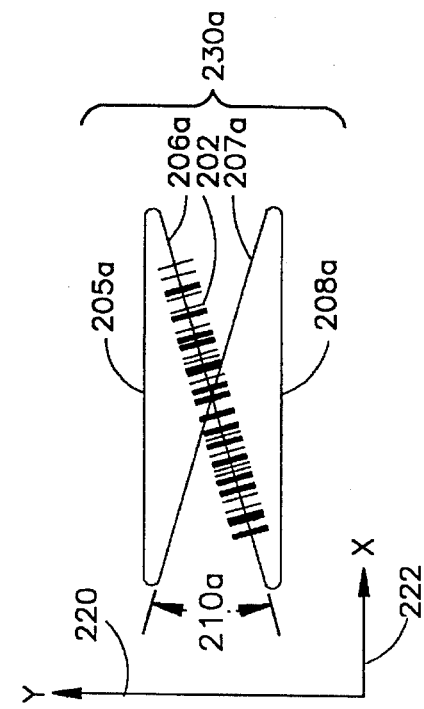
FIG. 18c shows a scan pattern similar to that of FIG. 18b where the Y scan component has finally increased enough to scan a bar code.

The first FIG. 18a in the sequence shows a scan line in the X direction only, and of course code 202 is not successfully scanned. A brief instant later a Y component is added to the scan pattern by applying an appropriate drive signal to the two dimensional scan element of FIG. 8 as previously described. Still the new scan pattern is not yet sufficiently expanded to successfully scan target code 202. Finally the Y amplitude is increased even more, as shown in FIG. 18c, and code 202 is successfully scanned by scan line 206a which has changed its angular orientation as the Y scan component was increased. Then the Y scan amplitude is increased even more as seen in FIG. 18d to cover a predetermined area, whereupon the sequence is reversed. This process of scanning is repeated in a continuous manner many times a second, and as a result, targets may be placed randomly oriented in the target area and successfully read. This technique of scanning is extremely useful for point-of-sale or portable scanners to increase productivity and to reduce frustration of the user. Of course the X- direction scan amplitude may also be modulated similarly to achieve useful omni-scanning according to this method.

Techniques for amplitude modulation of wave forms are well known and need not be of high precision or fidelity to be effectively employed in this novel method of scanning.

Also it should be pointed out that if, in the scan element of 5 FIG. 8, mirror 52 were held fixed and mirror 79 were caused to resonate with components of motion in the X and Y directions at appropriately different frequencies, these frequencies could also be amplitude modulated to produce expanding and collapsing lissajous figures to achieve time varying omni scan patterns according to the method just described.

DRIVE CIRCUITS FOR USE WITH THE SCAN ELEMENTS

Figure 17:
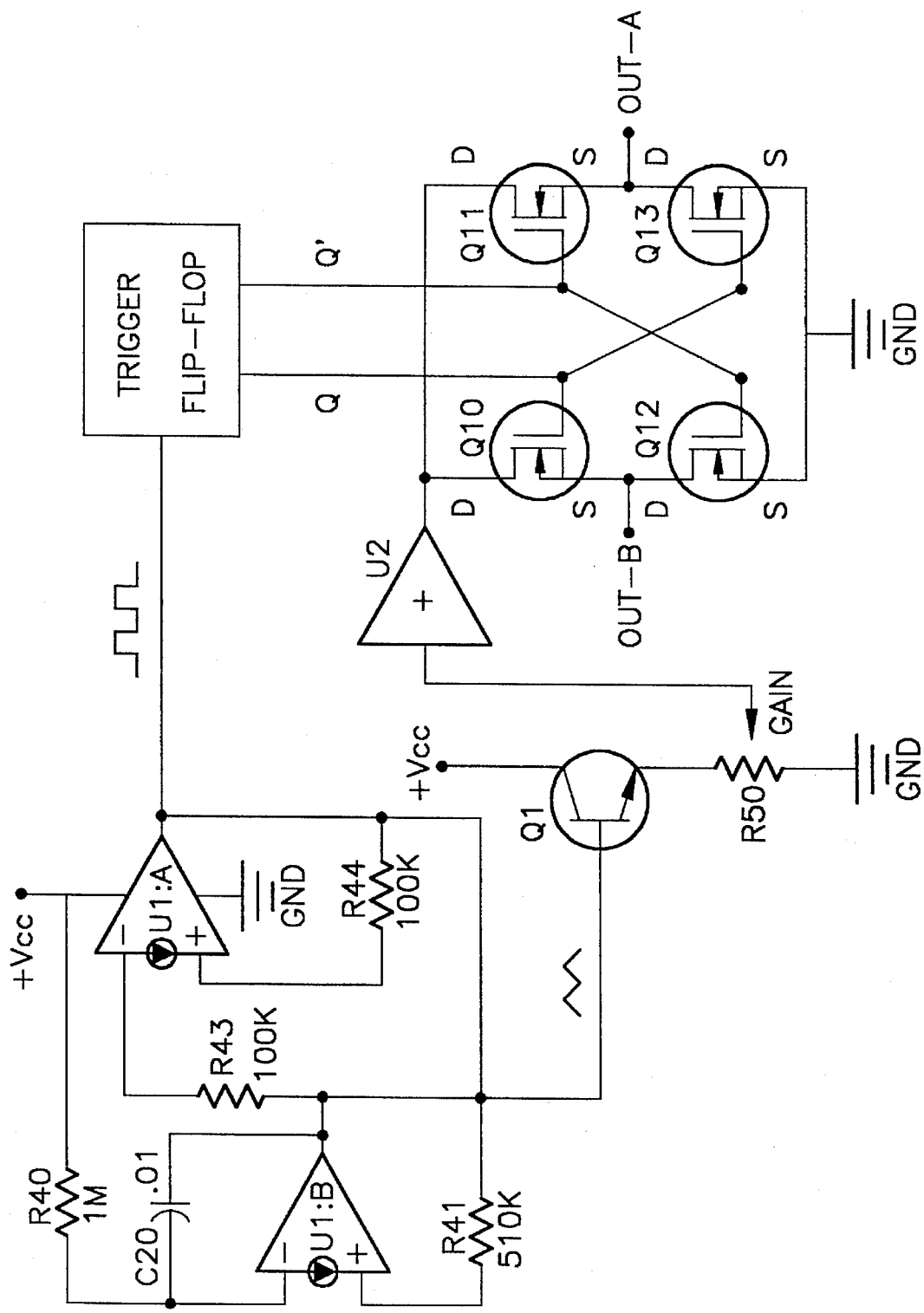
FIG. 17 shows a schematic diagram of a circuit for driving a scan element.

FIG. 17 shows a schematic diagram of a circuit for powering the scan elements of the present invention. Since the best mode of operation is considered to be at a frequency below resonance so that the scan element may sweep the beam at a generally constant speed, a triangle wave form is preferred. Also, for portable equipment, the circuit is designed to drive the scan element at low voltage from a single ended battery power supply.

In the circuit of FIG. 17 amplifiers U1A and U1B are current differencing amplifiers. A square wave is produced at the output of U1A at a frequency equal to the number of scans per second desired. The square wave is integrated by amplifier U1B to form triangle waves of the same frequency. The current differencing amplifiers allow integration of the square wave without the need for a double ended power supply. The square waves are fed into a trigger flip-flop to yield square waves at Q and Q' which are 180 degrees out of phase with one another and have one half the frequency of the original square wave from U1A. The outputs Q and Q' drive the two legs of an H-Bridge consisting of low on resistance MOS FET drive transistors Q10, Q11, Q12, and Q13. The triangle wave from U1B is one diode drop above ground so it is fed into the base of transistor Q1 which acts as an emitter follower to buffer the signal from U1A. The base-emitter voltage drop of Q1 causes the bottom peak of the triangle wave appearing at the emitter resistor R50 of Q1 to be referenced to ground potential. The emitter resistor of Q1 is a potentiometer which feeds a triangle wave of the desired amplitude to the input of positive buffer amplifier U2 which supplies drive signal to the drains of Q10 and Q11. As the two branches of the H-Bridge are alternately turned on and off at the gates of the drive transistors an alternating current triangle wave form appears at the output of the H-Bridge to drive the scan element at a frequency equal to one half the square wave frequency of U1A. Also since industry standard decoders usually require a start- of-scan signal to signify the start of scanning, either Q or Q' or both of these signals will suit this purpose. This circuit therefore supplies the necessary alternating drive current to operate the scan element efficiently from a single ended power supply and also delivers the necessary start-of-scan signals for standard decoders.

BEAM CONDITIONING

Extended depth of operating range is provided by a compact continuously variable focal element or focuser which is now disclosed.

Figure 11:
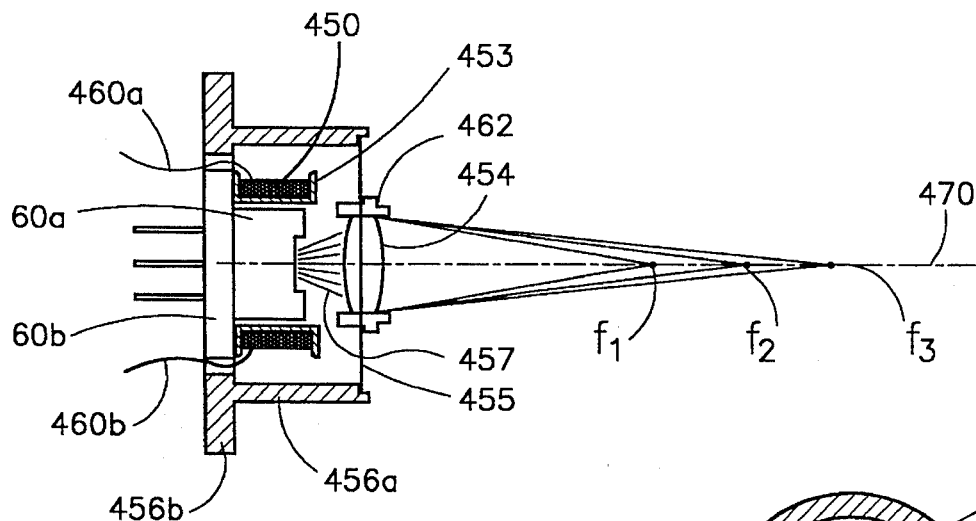
FIG. 11 shows a compact electrically focusable device for use with the compact scanning system.

In FIG. 11 a light source 60 is preferably in a ferromagnetic housing as are the packages of some of the newer visible laser diodes such as Toshiba part number TOLD 9221M. A focus coil 450 surrounds the ferromagnetic housing of the light source 60 so that the housing forms the core of an electromagnet. A resilient flexible suspension 455 made from flat ferromagnetic magnetic material such as steel about 2 mils thick suspends miniature beam converging optical element 454 above the housing of light source 60. The simplest form of element 454 is a positive lens but a hologram, axicon, or other non-imaging beam converging element could be adapted. For simplicity, element 454 will be referred to as a lens.(Suspension 455 need not be completely magnetic; just having its central portion magnetic would also work. Also a thin magnet with a hole in its center for the beam to pass through may also be added to the center of suspension 455 to increase electrical efficiency.) Typically lens 454 is chosen to have a short focal length, on the order of about 3 mm. Upon energizing coil 450, suspension 455 is pulled in toward the housing of the light source 60 which moves lens 454 toward the light source resulting in focusing the beam at different points such as f1, f2, f3 down range along axis 470 depending upon the magnitude of the current introduced into coil 450. A particular advantage of this focus element is that it does not waste light as would occur if a very small stop aperture were used to gain field depth.

Figure 12:
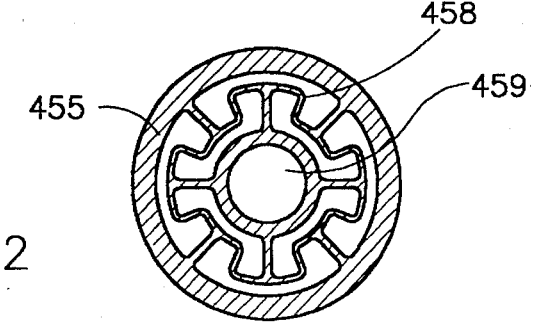
FIG. 12 shows a flexible focus suspension for use with the device of FIG. 11.

It has been found that a structure for resilient optical suspension 455 such as the one illustrated in FIG. 12 is ideal for suspending positive lens 454 because it preferentially moves in the direction of axis 470 while minimizing tilting of the lens. In addition to holding lens 454 suspension 455 can be fabricated with an aperture 459 to gain additional control over the spot size and shape as desired. The axial symmetry of the focus device of FIG. 11 makes it ideal for incorporating into the inventive in-line modular scan system shown in FIG. 10. Focus coil 450 with suspension 455 attached is typically fitted around magnetic light source housing 60a so that the beam is focused at a first position along axis 470 and is then cemented in place.

Application of an asynchronous drive current to coil 450 which varies slowly with respect to the scan rate of the scan element results in moving the focal point of the beam down range along axis 470 while the beam rapidly scans. The net result of this scan method is that a target somewhere down range will eventually come into adequate focus during a scan sequence. For example, if the scan element rate is 40 scans per second and the focal element is driven about 4 Hz, or back and forth 8 times per second, then a target at a given location will be in sufficient focus about 8 times a second. Since only one good scan is needed and one second is not a long scan period, the perception of a user will be that the scanner has a great depth of scan range. A triangle wave form generator such as the one of FIG. 17 would also be well suited for use with the focus coil.

AUTOMATIC TRIGGERING AND RANGE INDICATION

In order for a decoder to receive information from a bar code scanner, a trigger signal is supplied to it which is simply a logical 1 or 0 during data transmission. The trigger can be a manual switch as is found on contact wands or portable type scanners. However manual triggers are not well suited for fixed mount operation.

Figure 20:
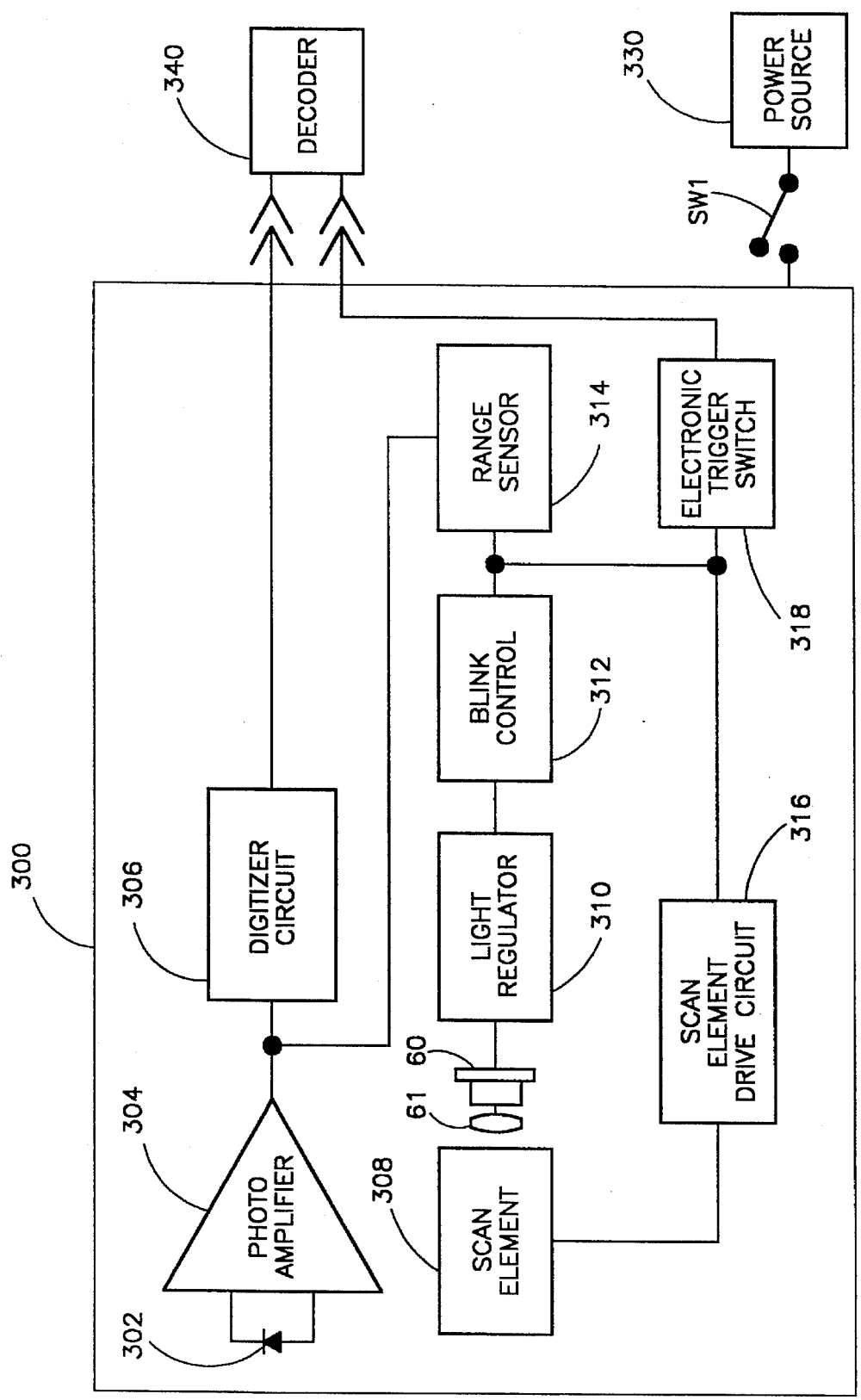
FIG. 20 shows a block diagram of the automatic triggering and visual feedback system.

In one embodiment of the present invention an automatic internal electronic trigger is employed which allows the present invention to be used for either fixed mount or hand held operation as desired. In addition the trigger system now described gives the user both target positioning and range feedback even in strong ambient lighting conditions. A power switch S1 operatively associated with the scanner as shown in FIG. 20, turns the scan system 300 ON when activated but does not energize beam scan element 308. Typically switch S1 is located on the housing of the scanner and is operable both as a momentary or constant on switch. It may be mechanical as found on some flashlights or a touch type switch such as a capacitance switch so that by touching the housing of the scanner it will go on.

When switch S1 is activated light source 60 is caused to blink rapidly like a strobe by blink control 312, preferably with a low duty cycle and at a rate humanly perceptible such as 30 blinks per second. It is well known that a blinking signal is easier to spot than a constantly on light signal. When the blinking commences the beam is not yet scanned. Thus an intense spot of light is created which can be seen even in strong ambient light like that of a laser pointer at close range so that the mutual position of target and beam can be brought into position for scanning. This feature allows a target to be positioned in front of the scanner or the scanner to be aimed at the target with equal convenience and at the same time save power. The blink mode is typically timed to provide at least a few blinks before scanning is commenced. During the blink mode, the photo amplifier 304 and digitizer circuit 306 is also turned on by the power switch S1 and detects reflected blinking light from the target. When the detected light is strong enough as detected by range sensor 314 for the target to be in range, an internal electronic trigger switch 318 such as a transistor switch is activated to alert the decoder that information is on the way. At the same time the scan element is turned on and scans the beam, and the light source ceases blinking and is put into a constant ON mode by blink control 312. If the target is too far away and out of range, the blinking simply continues as long as power switch S1 is on, indicating to the user that the target is out of range. It should be pointed out that triggering is not only automatic but depends on the scanner and target to be in the correct range for successful scanning. Since human operators can perceive intervals on the order of about 50 milliseconds initiation of adequate scan angle longer than about 100 milliseconds is perceived as sluggish or "non aggressive" thus techniques like the one just described would highlight the slow start up times of prior art scanners. Because the scan elements of the present invention start virtually instantly, and visual range feedback to the user is provided by the present invention, it is practical to implement the above described system without the perception of having to wait for the scan line to reach its normal scan angle. Furthermore, the time consuming trial and error methods associated with finding the correct range for the prior art scanners make the scanner of the present invention more productive and admirably useful for either hand held or fixed mount operation.

Since the methods of transistor switching and timing circuits are elementary and well known there is no need to describe the many ways of implementing the above circuit function.

INTEGRATED SCAN SYSTEM

Figure 10:
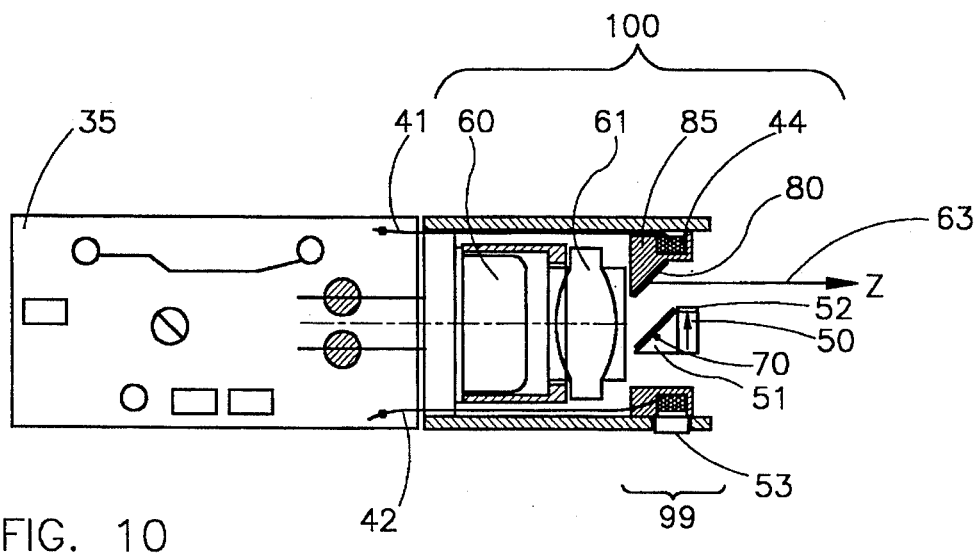
FIG. 10 shows an axial scan element integrated with other components to form an ultra compact light beam scanning system.

Now turning to FIG. 10 a scan element 99 is shown installed into a module 100 comprised of light source 60, focus element 61, which in this case is a positive lens for converging the beam from the light source, and a drive circuit 35 for powering the module. The focus element 61 may be replaced with virtually no space penalty by the novel electrically movable focus element shown in FIG. 11 for greatly improved depth of field operation.

Figure 13:
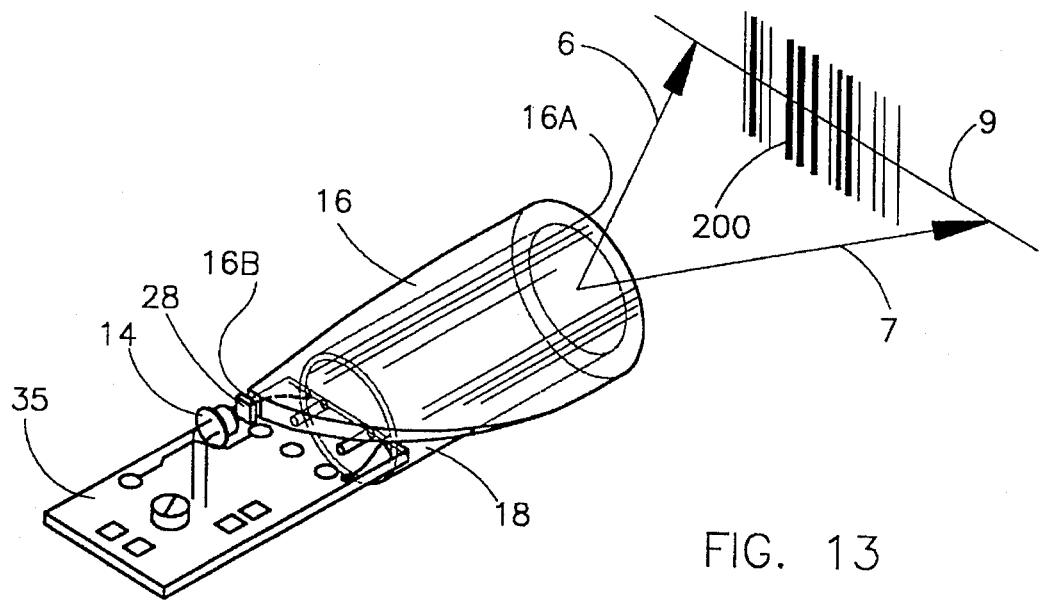
FIG. 13 shows a compact in-line scan system with a light collector.

Turning now to FIG. 13 a scan module is shown wherein light is collected and concentrated by coaxial optical element 16. This type of light collector was described in U.S. patent application Ser. No. 07/776,663 of which the present application is a continuation-in-part. Light collector 16 is preferably made from transparent plastic with a high index of refraction and acts to funnel light onto photoelectric converter 14 by total internal reflection rather than by imaging. An optical filter 16B filters out unwanted wavelengths of light. Thus because of its hollow cylindrical shape light collector 16 can fit around module 18 which contains components similar to those shown in FIG. 10. Module 18 has been fabricated with a diameter of ⅜ inch and length ¾ inch and the overall diameter of light concentrator 16 can be about ½ inch so that the module of FIG. 13 can fit into a pen or wand as shown in FIG. 14.

Figure 14:
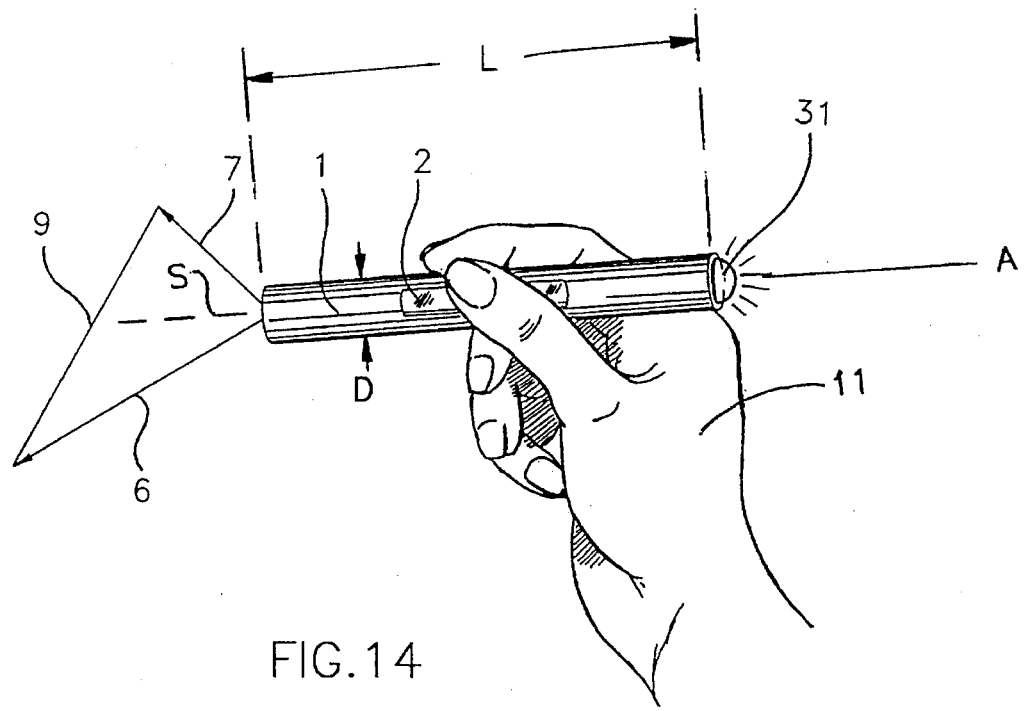
FIG. 14 shows a complete pen or wand shaped beam scanning system.

An entire scanning system for generating a beam, focusing the beam electronically, scanning the beam, collecting light from a target and converting it into electrical signals can compactly be housed into the non-contact beam scanning pen or wand as shown in FIG. 14. The system is also so small that it may be incorporated into a compact pocket size calculator type terminal with a key pad and display. Such a scan terminal when integrated with non-contact thermometers presently available and finger type blood pressure sensors would make a terminal ideally suited for the health care industry.

In addition to the advantages of the system already described, the quick start features and range feedback features of the present invention provides even further advantages. For example in prior art terminals such as described in U.S. Pat. No. 4,758,717 and U.S. Pat. No. 5,130,520 a micro processor is used to determine a successful scan and to automatically terminate scanning when complete. Such methods are useful in slow speed prior art scanners which suffer from slow startup and limited range of operation. The user must try various ranges and adjust aim until the terminal tells him, usually with a beep, that scanning was finally successful then turns itself off to conserve power. With the high speed, quick start, auto ranging scanner embodiments of the present invention it is no longer necessary to employ a micro processor to terminate scanning. Since the probability of instantly reading and decoding a target is much higher with the present invention, the scanner can be activated in the portable terminal mode for about 250 milliseconds then terminated with a simple RC time out circuit during which time many successful scans will have occurred.

While various embodiments of the present invention have been set forth, variations will no doubt occur to those skilled in the art without departing from the spirit and scope of the invention.

What is claimed is:

1. A light beam scanning system for scanning a target to read information therefrom, said system comprising a scan element for receiving a light beam and directing it toward a target as a scanning beam with an angular oscillatory movement of said beam about a neutral axis, said scan element comprising:

a coil for carrying electric current, said coil having a coil axis and an opening along said coil axis;

a shaft having a shaft axis disposed substantially perpendicular to said coil axis;

a magnetic element mounted for rotation about said shaft axis in response to current in said coil and producing a magnetic field oriented generally perpendicular to said shaft axis;

a first beam-directing optical element which is coupled to said magnetic element for rotation therewith about said shaft axis; and a ferromagnetic circuit including at least one ferromagnetic element disposed with respect to said magnetic element so as to establish a minimum energy rotational orientation of said magnetic element in which said magnetic field of said magnetic element is oriented generally perpendicular to said coil axis.

2. The system of claim 1, wherein said ferromagnetic circuit includes a ferromagnetic element which at least partially surrounds said coil.

3. The system of claim 1, wherein said ferromagnetic circuit includes a magnet.

4. The system of claim 3, wherein said ferromagnetic circuit includes a ferromagnetic ring which substantially surrounds said coil.

5. The system of claim 3, wherein the magnetic field of said magnet is oriented generally parallel to the magnetic field of said magnetic element.

6. The system of claim 1, wherein said scan element directs said light beam about a neutral axis which is generally parallel to the light beam received by the scan element.

7. The system of claim 1, wherein said first beam-directing optical element is a first mirror, further including a second mirror, said first and second mirrors being disposed so that an incident light beam reflected from one of said mirrors toward the other of said mirrors is reflected from said other of said mirrors in a direction which is generally parallel to said incident beam.

8. The system of claim 1, further including a single ended power supply and a drive circuit operable from said single ended power supply to produce a waveform for driving said coil.

9. The system of claim 1, wherein said first optical element is a mirror which in said minimum energy orientation is oriented diagonally with respect to said coil axis.

10. The system of claim 1, wherein said ferromagnetic element includes a portion adapted to be adjusted in position so as to establish the direction of the neutral axis about which the scanning beam is directed.

11. The system of claim 1, wherein said scan element directs said light beam about a neutral axis which is generally parallel to said coil axis.

12. The system of claim 1, wherein said coil is wound on a bobbin, and said shaft is mounted to said bobbin.

13. A scan element for receiving an input light beam along an input axis and directing it as a scanning beam with an angular oscillatory movement of said scanning beam about a neutral axis, said scan element comprising:

a coil for carrying electric current, said coil having a shape which is generally tubular with a coil axis, an opening along said coil axis, and an outer peripheral region;

a rotor mounted for rotation about a rotation axis, said rotation axis being oriented generally perpendicular to said coil axis, said rotor including a rotor magnet producing a magnetic field oriented generally perpendicular to said rotation axis, said rotor magnet imparting torque to said rotor about said rotation axis in response to current in said coil;

biasing means magnetically interactive with said rotor magnet for establishing an equilibrium rotational orientation of said rotor and imposing upon said rotor, when said rotor is rotated from said equilibrium orientation, a torque urging said rotor toward said equilibrium orientation; and an optical assembly disposed to receive an input light beam along an input axis and direct it as an output beam, said optical assembly including a first beam-directing optical element which is mounted to said rotor so as to establish a neutral axis of said output beam when said rotor is in said equilibrium orientation and to rotate therewith about said rotation axis in response to current in said coil and thereby scan said output beam.

14. A scan element according to claim 13, wherein said neutral axis is generally parallel to said coil axis.

15. A scan element according to claim 13, wherein said input axis is generally parallel to said coil axis.

16. A scan element according to claim 13, wherein said neutral axis is generally parallel to said input axis.

17. A scan element according to claim 13, wherein said coil axis, input axis, and neutral axis are generally parallel to each other.

18. A scan element according to claim 13, wherein the optical path of a light beam received and directed by said optical assembly includes a portion lying within said coil opening.

19. A scan element according to claim 18, wherein said optical path passes through said coil opening.

20. A scan element according to claim 13, wherein said biasing means includes a ferromagnetic element disposed in said outer peripheral region.

21. A scan element according to claim 13, wherein said biasing means includes a ferromagnetic element disposed so as to concentrate and direct flux from said rotor magnet through said coil.

22. A scan element according to claim 13, wherein said biasing means includes a biasing magnet disposed in said outer peripheral region.

23. A scan element according to claim 22, wherein said biasing magnet is disposed with its magnetic field oriented generally parallel to the magnetic field of said rotor magnet.

24. A scan element according to claim 13, wherein said biasing means includes a ferromagnetic ring disposed in said outer peripheral region.

25. A scan element according to claim 13, wherein said biasing means includes a ferromagnetic element which is adjustably positionable in said outer peripheral region so as to adjust the magnetic interaction between said biasing means and said rotor.

26. A scan element according to claim 25, wherein said adjustably positionable ferromagnetic element adjusts said equilibrium orientation of said rotor.

27. A scan element according to claim 25, wherein said adjustably positionable ferromagnetic element includes a magnet.

28. A scan element according to claim 25, wherein said adjustably positionable ferromagnetic element includes a ring of ferromagnetic material at least-partially surrounding said coil.

29. A scan element according to claim 13, wherein said first beam-directing optical element and said rotor magnet are located so that their moments of inertia about said rotation axis at least partially balance.

30. A scan element according to claim 13, wherein said rotation axis is defined by a shaft.

31. A scan element according to claim 30, wherein said coil is wound on a bobbin, and said shaft is mounted to said bobbin.

32. A scan element according to claim 13, wherein said rotor magnet is located along said coil axis.

33. A scan element according to claim 13, wherein said rotor magnet is located in said coil opening.

34. A scan element according to claim 13, wherein said first beam-directing optical element is a partially reflective and partially transmissive element.

35. A scan element according to claim 13, wherein said first beam-directing optical element is a mirror.

36. A scan element according to claim 35, wherein said mirror is oriented diagonally with respect to said coil axis.

37. A scan element according to claim 13, wherein said optical assembly includes a second beam-directing optical element, said first and said second beam-directing optical elements each including a reflecting surface, said reflecting surfaces of said first and said second beam-directing optical elements being oriented generally parallel to each other.

38. A scan element according to claim 13, including a generally tubular magnetic shield located in said outer peripheral region.

39. A scan element according to claim 38, wherein said generally tubular magnetic shield is generally coaxial with said coil and at least about coextensive with said coil along said coil axis.

40. A method of scanning a light beam to provide a scanning beam with an angular oscillatory movement of said scanning beam about a neutral axis, comprising the steps of:

mounting a rotor, comprising a rotor magnet and a first beam-directing optical element, for rotation about a rotation axis oriented generally perpendicular to the magnetic field of said rotor magnet;

directing an input light beam along an input axis of an optical assembly which includes said first beam-directing optical element, said optical assembly directing said input light beam to provide an output beam;

magnetically biasing said rotor to magnetically establish an equilibrium rotational orientation of said rotor and magnetically impose upon said rotor, when said rotor is rotated from said equilibrium orientation, a torque urging said rotor toward said equilibrium orientation, said equilibrium orientation of said rotor determining a neutral axis of said output beam;

disposing a coil in a location with respect to said rotor in which energizing said coil imparts torque to said rotor magnet about said rotation axis; and energizing said coil with a periodic current, thereby imparting a periodic motion to said output beam with respect to said neutral axis so as to scan said output beam.

41. A method according to claim 40, wherein said biasing step includes adjusting the position of a ferromagnetic element so as to adjust said equilibrium orientation of said neutral axis.

42. A method according to claim 40, wherein said biasing step includes establishing a rotational resonant frequency of said rotor.

43. A method according to claim 42, wherein said energizing step includes energizing said coil with a periodic current at a frequency which is about said rotational resonant frequency of said rotor.

44. A method according to claim 42, wherein said energizing step includes energizing said coil with a periodic current at a frequency which is substantially less than said rotational resonant frequency of said rotor.

45. A method according to claim 44, wherein said energizing step includes energizing said coil with a periodic current having a generally triangular waveform.

46. A method according to claim 42, wherein said energizing step includes energizing said coil with a periodic current producing between about 10 and about 200 scans per second of said output beam.

47. A method according to claim 42, wherein said energizing step includes energizing said coil with a periodic current producing on the order of about 40 scans per second of said output beam.

48. A method according to claim 40, wherein said coil has a coil axis, and said biasing step establishes said equilibrium orientation of said rotor so that said neutral axis of said output beam is generally parallel to said coil axis.

49. A scan element for receiving an input light beam along an input axis and directing it as a scanning beam with an angular oscillatory movement of said scanning beam about a neutral axis, said scan element comprising:

a coil for carrying electric current, said coil having a shape which is generally tubular with a coil axis, an opening along said coil axis, and an outer peripheral region;

a shaft disposed generally perpendicular to said coil axis;

a rotor mounted for rotation about a rotation axis determined by said shaft, said rotation axis being oriented generally perpendicular to said coil axis, said rotor including a rotor magnet producing a magnetic field oriented generally perpendicular to said rotation axis, said rotor magnet imparting torque to said rotor about said rotation axis in response to current in said coil;

a ferromagnetic circuit including at least one ferromagnetic element, said ferromagnetic circuit being magnetically interactive with said rotor magnet so as to establish an equilibrium rotational orientation of said rotor in which said magnetic field of said rotor magnet is oriented generally perpendicular to said coil axis and so as to impose upon said rotor, when said rotor is rotated from said equilibrium orientation, a torque urging said rotor toward said equilibrium orientation, said ferromagnetic circuit including a ferromagnetic element having a generally tubular portion located in said outer peripheral region and oriented generally coaxially with said coil; and an optical assembly disposed to receive an input light beam along an input axis and direct it as an output beam, said optical assembly including a first beam-directing optical element which is mounted to said rotor so as to establish a neutral axis of said output beam when said rotor is in said equilibrium orientation and to rotate therewith about said rotation axis in response to current in said coil and thereby scan said output beam.

50. A scan element according to claim 49, wherein said tubular portion of said ferromagnetic element is at least about coextensive axially with said coil.

51. A scan element according to claim 49, wherein said tubular portion of said ferromagnetic element is at least about coextensive axially with said scan element.

52. A scan element according to claim 49, further including a bobbin supporting said coil, wherein said shaft is mounted to said bobbin.

53. A scan element according to claim 52, wherein said shaft is secured to said bobbin, and said rotor is rotatably mounted on said shaft.

54. A scan element according to claim 53, Wherein said rotor includes a rotor mount by which said rotor is rotatably mounted on said shaft, said rotor mount comprising a lubricated plastic material.

55. A scan element according to claim 52, wherein said shaft is secured to said rotor, and said shaft is rotatably mounted to said bobbin.

56. A scan element according to claim 49, wherein said neutral axis is generally parallel to said coil axis.

57. A scan element according to claim 49, wherein said input axis is generally parallel to said coil axis.

58. A scan element according to claim 49, wherein said neutral axis is generally parallel to said input axis.

59. A scan element according to claim 49, wherein the optical path of a light beam received and directed by said optical assembly passes through said coil opening.

60. A scan element according to claim 49, wherein said first beam-directing optical element is a mirror which, in said equilibrium orientation, is oriented diagonally with respect to said coil axis.

61. A scan element according to claim 49, wherein said optical assembly includes a second beam-directing optical element, said first and said second beam-directing optical elements each including a reflecting surface, said reflecting surfaces of said first and said second beam-directing optical elements being oriented generally parallel to each other.

* * * * *